United States Patent [19]

Widdoes, Jr.

[11] Patent Number: 4,590,581

[45] Date of Patent: May 20, 1986

[54] METHOD AND APPARATUS FOR MODELING SYSTEMS OF COMPLEX CIRCUITS

[75] Inventor: L. Curtis Widdoes, Jr., Sunnyvale, Calif.

[73] Assignee: Valid Logic Systems, Inc., San Jose, Calif.

[21] Appl. No.: 492,985

[22] Filed: May 9, 1983

[51] Int. Cl.$^4$ .......................... G06G 7/48; G06G 11/00
[52] U.S. Cl. ........................................ 364/578; 371/20
[58] Field of Search ....................... 371/20, 23, 24, 25, 371/26, 27; 364/578, 149, 150, 151

[56] References Cited

U.S. PATENT DOCUMENTS

| | | |
|---|---|---|
| 3,643,156 | 2/1972 | Stewart et al. |
| 3,927,371 | 12/1975 | Pomeranz et al. |
| 4,066,882 | 1/1978 | Esposito ............................... 371/20 |
| 4,070,565 | 1/1978 | Borrelli ............................... 364/580 |
| 4,196,475 | 4/1980 | Hall |
| 4,213,175 | 7/1980 | Kuriharg ............................. 364/151 |
| 4,242,751 | 12/1980 | Henchels et al. |
| 4,342,093 | 7/1982 | Miyoshi ............................... 364/578 |
| 4,402,055 | 8/1983 | Lloyd et al. .......................... 371/20 |
| 4,404,635 | 9/1983 | Flaker |
| 4,450,560 | 5/1984 | Conner |

OTHER PUBLICATIONS

E. G. Ulrich, "Exclusive Simulation of Activity in Digital Networks", Communications of the ACM, vol. 12, No. 2, Feb. 1969, pp. 102–110.
J. R. Armstrong et al., "Chip-Level Simulation of Microprocessors", Computer, vol. 13, No. 1, Jan. 1980, pp. 94–100.
S. A. Szygenda et al., "Digital Logic Simulation in a Time-Based, Table-Driven Environment Part 1, Design Verification", Computer, vol. 8, No. 3, Mar. 1975, pp. 24–36.
Szygenda et al., "Modeling and Digital Simulation for Design Verification and Diagnosis," IEEE Transactions vol. C-25, No. 12 Dec. 1976, pp. 1242–1253.
Beaven et al. Simulation and Testing of Three State Logic Circuitry, 1978, IBM Technical Disclosure, pp. 1662–1663 vol. 21, No. 4.

Primary Examiner—John W. Caldwell, Sr.
Assistant Examiner—Donna L. Angotti
Attorney, Agent, or Firm—Townsend & Townsend

[57] ABSTRACT

A simulation model is provided which comprises a combination of the physical device to be modeled and means for controlling the physical device at normal operating speeds so as to avoid loss of data or of accumulated functions. Specifically, the physical device to be modeled is connected through a micro-system simulation means which can accept any of a wide variety of external devices and which includes the logic circuitry and control means necessary to allow the physical device to be stimulated and the resulting behavior observed under external control. Data and logic state patterns are preserved by effective control of the starting, stopping, cycling and resetting of the physical device.

20 Claims, 3 Drawing Figures

METHOD AND APPARATUS FOR MODELING SYSTEMS OF COMPLEX CIRCUITS

BACKGROUND OF INVENTION

1. Field of Invention

This invention relates to modeling of operation of complex large scale integration (LSI) or very large scale integration (VLSI) digital devices for use in development and testing of digital systems. More specifically, the invention relates to logic simulation and testing of complex digital circuitry and systems including those capable of executing instructions under program control in which digital performance characteristics of static or dynamic LSI or VLSI devices must also be accurately simulated.

A logic-simulation model of a device is a diagnostic tool which accurately mimics digital logic and timing behavior of a device in normal operation. The purpose of such a model is to verify both logic and timing of an operational digital system containing the device. In a logic-simulation model, internal operation and internal structure need not be similar to that of the actual device being simulated. The only prerequisite is that the simulated operation and simulated timing as externally observed be identical to that of the actual device being modeled.

2. Description of the Prior Art

Traditionally, logic-simulation models have been implemented with software. Software logic-simulation models have been of two types, namely structural models and behavioral models. A structural model mimics actual internal logical structure of a device from which observable functional behavior follows. A behavioral model merely mimics external logical and timing behavior.

Software models of complex devices have numerous disadvantages. First, they are relatively costly and time consuming to develop. To design an accurate model, specifications of the device must be gathered and thoroughly understood. This has been a serious limitation because manufacturers of devices are generally reluctant to disclose such details. Moreover, the specifications required for modeling a device are typically much more detailed than those relevant to a typical user of the device.

Second, software simulation models are characteristically slow because of the amount of computation required to simulate device functions. Typically, the amount of computation required to simulate external components in a full system being modeled is negligible compared with the amount of computation required for the complex device itself. In fact, software logic simulation models are frequently too slow to be of practical utility.

Heretofore, there have been few tools available to simulate the operation of a dynamic digital device in real-time using a physical device. Some diagnostic tools are known, as for example an In-Circuit Emulator (ICE) from Intel Corporation of Santa Clara, Calif. The In-Circuit Emulator provides means for cycling microprocessor devices and for stopping at well-defined points during operation, such as during a device idle state. Consequently, there is no capability of or suggestion for resetting the device during normal operation of the system.

As complex devices become more dense, the problems of simulation, including development cost, model accuracy, and the requirements to simulate at high speed can be expected to become acute. What is therefore needed is a diagnostic tool for simulating operation of complex digital devices, in particular dynamic digital devices, for use in developing and testing larger systems which requires only minimal relevant information and which enables a system under development or test to be simulated using a known good device.

SUMMARY OF THE INVENTION

According to the invention, a simulation model is provided which comprises a combination of the physical device to be modeled and means for controlling the physical device at normal operating speeds so as to avoid loss of data or of accumulated functions. Specifically, the physical device to be modeled is connected through a micro-system simulation means which can accept any of a wide variety of external devices and which includes the logic circuitry and control means necessary to allow the physical device to be stimulated and the resulting behavior observed under external control. Data and logic state patterns are preserved by effective control of the starting, stopping, cycling and resetting of the physical device.

In a specific embodiment, a known good physical sample of the device being modeled, for example a dynamic digital circuit, such as a microprocessor circuit is employed in connection to a digital system to be tested, the system including other digital circuits to be tested in the environment of the system. The physical sample, herein called the reference element, is coupled through a device herein designated as a personality module to a device herein designated a simulation jig. The purpose of the personality module is to provide the electrical and physical configurations for interfacing the specific reference element with the simulation jig. The simulation jig is coupled to a computer controlled system herein designated a logic-simulator thereby to provide appropriate input signals and to sample the resulting output signal in such a way that the user need not be aware that the reference element is either a software or a hardware model. In fact, a user of a simulation library may mix devices having software models with devices having physical models without concern about type.

In a specific implementation of the invention, a first input pattern is precomputed and stored in a fast memory. An input pattern is the parallel pattern of bits presented during an interval of time (e.g., at a clock edge) to the reference element. Before the reference element is initially exercised it is first reset or restored to a preselected condition which can be identically restored at any future time. The first or initial input pattern may be termed the first "sequence". It is typically fetched from the fast memory and presented to input terminals of the reference element to cause the reference element to respond to produce an output pattern. The output values resulting from the first input pattern are termed the first output pattern. Thereafter the resultant first output pattern of the reference element is recorded. Using the first output pattern, the logic-simulator computes a second input pattern which is then stored in the fast memory along with the first input pattern, thereby creating a second sequence. The second sequence thus consists of the first and second input patterns. The reference element is reset to prepare to receive the second sequence. Thereafter the second sequence is played back to the reference element by sequentially presenting to the reference element the first two input patterns at a preselected rate. After the end of the second sequence of input patterns has been played back to the reference element, the second output pattern of output values of the reference element is sampled. Employing the resultant output pattern, the logic-simulator according to the invention may compute off-line the next input pattern, store this computed input pattern at the end of the sequence of input patterns previously stored, reset the reference element, either by activating a reset signal line or by applying a reset pattern sequence to the reference element, and then repeat the sequence of input patterns such that the next operational sequence produces one additional input pattern.

The logic-simulator according to the invention therefore iteratively advances the state of the reference element by starting each sequence of iterations from a reference state herein designated the reset state.

The use of the reset signal or reset pattern sequence is an important advancement because it allows the timing requirements of the reference element to be met without requiring the reference element to stop at every clock cycle to permit the logic-simulator to compute responses at a convenient non-real-time rate.

The simulation model according to the invention thereby permits non-real-time simulation of systems, which is important to allow the use of software models for other devices in the digital system, while preserving the real-time characteristics of selected hardware reference elements of the system and it does so without having to generate a complex mathematical model of each element of the system under development or under test.

The invention will be better understood by reference to the following detailed description taken in connection with the accompanying drawings.

DESCRIPTION OF SPECIFIC EMBODIMENTS

In order to better understand the invention, it is helpful to consider operation of a typical embodiment.

Figure 1:
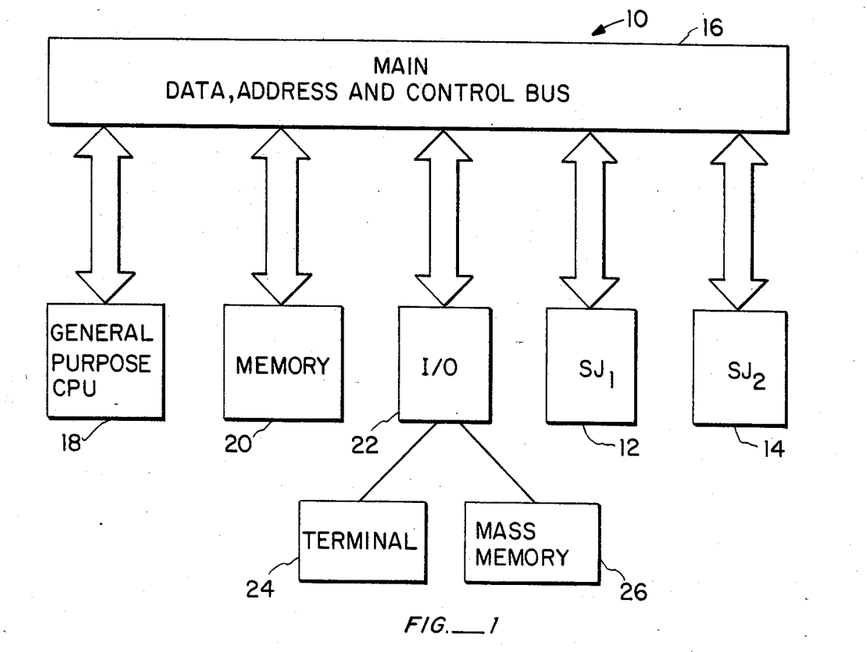
FIG. 1 is a block diagram of a simulation system with simulation modeling apparatus according to the invention.

Referring to FIG. 1, there is shown a simulation system 10 as might be configured in a general purpose digital computer having a general purpose central processing unit (CPU) 18 coupled to a main bus 16. The simulation system further may include a memory means 20 and input/output means (I/O) 22 coupled to the main bus 16. A control terminal 24 and mass memory 26 are coupled through the I/O 22 to the main bus 16. Whereas a completely software-based simulation requires no other hardware, in the present invention a first simulation jig (SJ$_1$) 12 and/or a second simulation jig (SJ$_2$) 14 may be coupled to the main bus 16. The function of the simulation jigs is explained in connection with FIG. 3.

Figure 2:
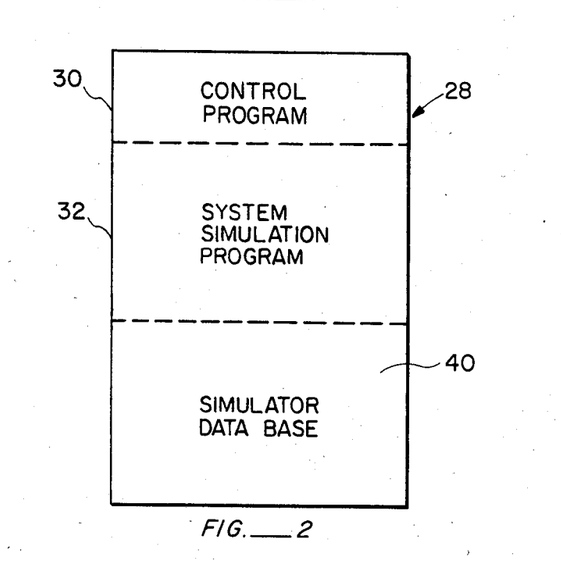
FIG. 2 is a representation of a memory map of a computer controlled simulation system.

Referring to FIG. 2, there is shown schematically how the software of the simulation system 10 may be organized in a memory map 28 of the memory 20. Memory space is set aside for a computer system control program 30 in a first memory address space of memory 20. A system simulation program 32 is stored as object code in a second address space. A simulator data base containing working data values for the system simulation program is stored on-line in memory address space 40. Memory address space 40 is also used to store data as required by the simulation program from the mass memory 26.

Figure 3:
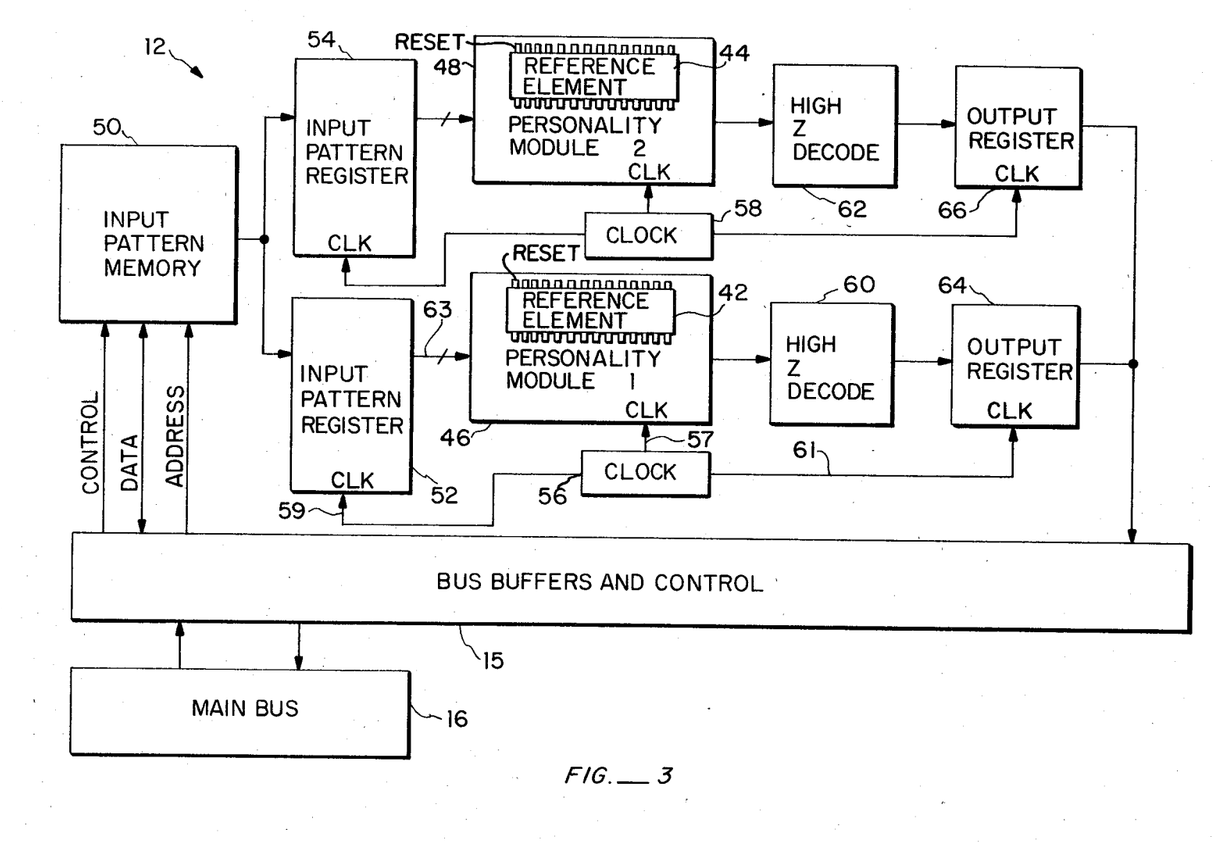
FIG. 3 is a block diagram of a micro-system simulation jig according to the invention.

Consider operation of a simulation jig 12 operative to present input patterns through an input pattern register 52 to a device herein known as a reference element 42, as shown in FIG. 3. (Most control signal lines have not been shown to avoid unnecessary complexity. Implementation of control functions is within the skill of the ordinary designer from the present description.) One or more clock signals having preselectable shape, clock rate and relative phase relationship may be presented by a clock 56 via clock lines 57, 59 and 61 to a personality module 46, the input pattern register 52 and the output register 64. The personality module 46 is a customized interface device which provides signal level matching and a suitable socket for a general purpose simulation jig 12. The simulation jig 12 is operative to present a set of input signals to the reference element 42 synchronous with the clock 56, which input signals represent values stored in an input pattern memory 50 containing the full set of defined input signal patterns in logical sequence. The input pattern memory 50 may be a serial or random access memory device with control lines and ports appropriate to the type of memory element selected.

At a fixed time before each clock edge, the input pattern register 52 of the simulation jig 12 is operative to present each set of defined input values to the reference element 42 via coupling 63. The reference element 42 is operative to produce output signals as if it were operating in a real-time environment in response to the defined input signal pattern. However, the output signals are ignored by the data recovery element, namely the output register 64, until all available input patterns in a sequence have been presented to the reference element 42. After the last input pattern has been presented to the reference element 42, clocking stops. An interval follows which is greater than the maximum specified delay of any output of the reference element 42 generated in response to any clock edge. Thereupon, the output values are sampled and stored in the output register 64. Thereafter, the simulator system 10 (FIG. 1), to which the simulation jig 12 is coupled via bus buffers and control 15 and main bus 16, examines the state of each output of the reference element 42. The states are evidenced by the values in the output register 64. The simulator system 10 then schedules the simulated outputs in the simulator data base 40 to change at specific delay times after the corresponding simulated clock edge. The specified delay time for each output is a function of the identity of the output and the specific clock edge which causes the change. It can be set to any time value between the minimum and the maximum delay as specified by the manufacturer and is a parameter which is specified in the definition of the device corresponding to the reference element 42. (Experience suggests that the maximum delay time be chosen in order to reveal the most timing errors in a design under development.)

According to the invention, the simulator system 10, having set up a schedule for simulated output signals from the reference element 42, proceeds to advance the state of the simulator data base 40 by computing other necessary values and advancing simulated time until the occurrence of the next simulated clock edge. The simulation system 10 then records the instantaneous values of the simulated input signals which are defined for the reference element 42 and stores them in the next location in the input pattern memory 50. The simulation system then generates a reset pattern sequence or a reset signal which is conveyed to the reference element 42 via one or more of the lines of coupling 63 and prepares the reference element 42 to repeat the process of cycling through all patterns. Thereafter, the entire set of defined input signal patterns, including the newly computed pattern, is presented in sequence to the reference element 42 through the personality module 46 within the predefined time tolerance for the input signals. This process is repeated until all operations of a simulation have been executed and all defined patterns of a sequence applied to the reference element 42 have been executed at the input pattern clock rate, the number of steps in the defined pattern being incremented by generally one clock cycle with each advance in the clock of the simulation system 10.

Devices according to the invention are generally limited to simulating only a finite number of cycles occurring within a finite amount of time following reset of the reference element 42. This limitation is due to the fact that the input pattern memory 50 has by definition only a finite capacity. The number of cycles simulated is thus a function of the size of the memory 50 associated with the simulation jig 12. Nevertheless, techniques may be used for extending simulation indefinitely. One such technique involves looping on a single input pattern (e.g., an idle pattern) while the input pattern memory 50 is reloaded with additional patterns.

Many adaptations of the basic invention will be apparent to those of ordinary skill in this art. For example, it should be understood that, because of the reset capability according to the invention, the clock rate associated with the reference element 42 may be selected to be anything convenient within specifications which preserve the logical behavior of the reference element 42. The actual clock rate in the simulation jig 12 may, therefore, be set to a value dependent on the access time of the input pattern memory 50 or any other constraints of the simulation jig 12. Moreover, the simulation clock rate, that is, the clock rate associated with the system in simulation, may differ from the clock rate for the reference element 42.

Many complex integrated circuit devices have terminals intended to be connected to three-state buses. In the present invention, such terminals may be driven both through the input-pattern register 52 and through the reference element 42 itself. These terminals may also be sampled by the output register 64.

Driver conflicts may arise in certain instances. In order to avoid driver conflicts, the input pattern memory 50 may have within it bits indicating high-impedance. If the simulated network coupled to the reference element 42 is not driving a specified reference element terminal, then the control of the simulation jig 12 may set the corresponding input pattern bit to indicate high-impedance. In a similar fashion, the simulation jig 12 may employ circuitry for sensing fully, that is, at all times or at all clock edges, the state of each input/output terminal of the reference element 42. A high-impedance decoder 60 between the personality module 46 and the output register 64 may serve these purposes.

The characteristics of certain devices employed as reference elements allow the reduction in the amount of storage required for input patterns. For example, input patterns may be repetitive. For this purpose, means may be provided for storing a repeated input pattern only once and for storing a number of repetitions and instructing the system to execute the input pattern the registered number of repetitions or even indefinitely.

The end of an input pattern sequence may be indicated by a stop bit as part of each input pattern. The stop bit is readable only by the system controlling the simulation. For example, the simulation jig 12 may be rendered operative for a particular personality module 46 by presenting to it a digital instruction to present a sequence of defined input patterns beginning with an indicated starting address in the input-pattern memory 50 and then ending with the first pattern in which it finds the stop bit set.

Other adaptations of the simulation system are apparent. For example, a single simulation jig 12 may provide means for accommodating one, two or even more personality modules to handle a plurality of reference elements in a time-shared manner. As shown in FIG. 3, this structure may take the form of a second input pattern register 54 coupled to receive defined input patterns from the input pattern memory 50 and to supply defined input patterns to a second reference element 44 on a second personality module 48. A second high-impedance decoder 62 may interface the second personality module 48 to a second output register 66 which in turn is coupled to the bus buffers and control 15 of the simulation system 10. In addition, the simulation system 10 could be provided with means for coupling to a plurality of simulation jigs 12, 14 to a main bus. Simulation jigs 12, 14 could be provided as a library of complex devices functionally mounted in a backplane arrangement, for example, in a backplane arrangement according to the Intel Multibus interface standard with several reference elements disposed upon each Multibus board.

The invention has now been explained with reference to specific embodiments. Other embodiments will be apparent to those of ordinary skill in the art. For example, the simulation system can be configured as a highly developed machine capable of producing useful information for a user in debugging hardware design and software design. Peripheral devices can be coupled to the simulation system to generate graphics and timing diagrams, and the simulation system can be instrumented in accordance with the needs of the user. Having thus explained the invention, it is not intended that the invention be limited except as indicated by the appended claims.

What is claimed is:

1. In a simulation system which produces digital input patterns for input to a model of a complex digital device, a method for modeling operation of said complex digital device within said simulation system, said method comprising:
    (a) presenting a first sequence of said digital input patterns to a reference element which is a physical specimen of said complex digital device to produce a digital output pattern, wherein said presenting step occurs at a clock rate which differs from the rate at which said digital input patterns are produced by said simulation system;
    (b) sampling said digital output pattern after said first sequence of said digital input patterns has been presented to said complex digital device;
    (c) allowing said simulation system to respond to said digital output pattern to produce the next one of said digital input patterns;

(d) storing said next one of said digital input patterns in succession with said first sequence of said digital input patterns to produce a second sequence of said digital input patterns;

(e) resetting said reference element independent of operation of said simulation system; and (f) repeating steps (a) through (e), said second sequence becoming said first sequence.

2. The method according to claim 1 wherein said resetting step (e) comprises activating a reset signal line of said reference element.

3. The method according to claim 1 wherein said resetting step (e) comprises presenting a preselected pattern or sequence of patterns of signals to said reference element.

4. The method according to claim 1, further including a further step of detecting high-impedance conditions at output terminals of said reference element.

5. The method according to claim 1 wherein said reference element includes time-shared input/output terminals and wherein said method further includes a further step of sensing fully signal values at said input-/output terminals.

6. In a simulation system which produces digital input patterns for input to a model of a complex digital device, a method for modeling operation of said complex digital device within said simulation system, said method comprising:

(a) presenting a first sequence of said digital input patterns to a reference element which is a physical specimen of said complex digital device to produce a digital output pattern;

(b) sampling said digital output pattern after said first sequence of said digital input patterns has been presented to said complex digital device and after a delay greater than a specified maximum delay for change in said digital output pattern;

(c) allowing said simulation system to respond to said digital output pattern to produce the next one of said digital input patterns;

(d) storing said next one of said digital input patterns in succession with said first sequence of said digital input patterns to produce a second sequence of said digital input patterns;

(e) resetting said reference element independent of operation of said simulation system; and (f) repeating steps (a) through (e), said second sequence becoming said first sequence.

7. The method according to claim 6 wherein said resetting step (e) comprises activating a reset signal line of said reference element.

8. The method according to claim 6 wherein said resetting step (e) comprises presenting a preselected pattern or sequence of patterns of signals to said reference element.

9. In a simulation system which produces digital input patterns for input to a model of a complex digital device, a method for modeling operation of said complex digital device within said simulation system, said method comprising:

(a) presenting a first sequence of said digital input patterns to a reference element which is a physical specimen of said complex digital device to produce a digital output pattern;

(b) sampling said digital output pattern after said first sequence of said digital input patterns has been presented to said complex digital device;

(c) allowing said simulation system to respond to said digital output pattern to produce the next one of said digital input patterns;

(d) storing said next one of said digital input patterns in succession with said first sequence of said digital input patterns to produce a second sequence of said digital input patterns;

(e) restoring internal states of said reference element to predetermined values in response to a predefined sequence of input patterns independent of operation of said simulation system in order to generate known digital output patterns without response by said reference element to an entire sequence of said digital input patterns; and (f) repeating steps (a) through (f), said second sequence becoming said first sequence.

10. The method according to claim 9 wherein said restoring step (e) comprises activating a reset signal line of said reference element.

11. The method according to claim 9 wherein said restoring step (f) comprises presenting a preselected pattern or sequence of patterns of signals to said reference element.

12. In a simulation system which produces digital input patterns for input to a model of a complex digital device, a method for modeling operation of said complex digital device within said simulation system, said method comprising:

(a) prestoring a first sequence of digital input patterns prior to said presenting step (b) in a memory means;

(b) presenting said first sequence of said digital input patterns to a reference element which is a physical specimen of said complex digital device to produce a digital output pattern;

(c) sampling said digital output pattern after said first sequence of said digital input patterns has been presented to said complex digital device;

(d) allowing said simulation system to respond to said digital output pattern to produce the next one of said digital input patterns;

(e) storing said next one of said digital input patterns in succession with said first sequence of said digital input patterns to produce a second sequence of said digital input patterns;

(f) resetting said reference element independent of operation of said simulation system; and (g) repeating steps (a) through (e), said second sequence becoming said first sequence.

13. The method according to claim 12, further including a further step of prestoring repetitive portions of said sequence of input patterns as a single segment.

14. The method according to claim 12 wherein said resetting step (f) comprises activating a reset signal line of said reference element.

15. The method according to claim 12 wherein said restoring step (f) comprises presenting a preselected pattern or sequence of patterns of signals to said reference element.

16. For use in a simulation system an apparatus for modeling operation of at least one complex digital device within said simulation system, said apparatus comprising:

means for storing at least a single digital input pattern in a sequence of digital input patterns for use as input signals to a reference element, said reference element being a physical specimen of said complex digital device;

means for electrically coupling said reference element to receive said input signals;

means electrically coupled to said reference element coupling means for controlling clocking of said reference element independent of operation of said simulation system;

means electrically coupled to said reference element coupling means for presenting to said reference element said sequence of said digital input patterns, said presenting means to reset said reference element, to repeatedly present said sequence of said digital input patterns to said reference element and to increment the number of clock cycles of said sequence of digital input patterns with each addition of a digital input pattern;

means electrically coupled to said reference element coupling means for sampling output signals of said reference element after said presenting of a last one of said digital input patterns in said sequence of digital input patterns, said output signals for use by said simulation system; and means electrically coupled to said presenting means and responsive to said simulation system for receiving and directing to said storing means a next one of said digital input pattern in said sequence of digital input patterns.

17. The apparatus according to claim 16 wherein said presenting means activates a reset means of said reference element prior to presenting said first sequence.

18. The apparatus according to claim 16 wherein said presenting means activates a predefined resetting pattern or sequence of resetting patterns electrically coupled to a reset means of said reference element prior to presenting said first sequence of digital input patterns.

19. The apparatus according to claim 16 wherein said sampling means includes means for detecting high-impedance conditions at output terminals of said reference element.

20. The apparatus according to claim 16 wherein said presenting means includes means for recording at least a portion of said sequence of digital input patterns for presenting said sequence of digital input patterns at a controlled rate to said reference element, said controlled rate being greater than the rate of receipt of said digital input patterns by said storing means.

* * * * *

UNITED STATES PATENT AND TRADEMARK OFFICE
CERTIFICATE OF CORRECTION

PATENT NO. : 4,590,581
DATED : May 20, 1986
INVENTOR(S) : L. Curtis Widdoes, Jr.

It is certified that error appears in the above-identified patent and that said Letters Patent is hereby corrected as shown below:

In claim 9, line 27, change "(f)" to --(e)--.

In claim 11, Line 2, change "(f)" to --(e)--.

In claim 12, line 24, change "(e)" to --(f)--.

In claim 15, line 2, change "restoring" to --resetting--.

Signed and Sealed this

Sixteenth Day of September 1986

[SEAL]

Attest:

DONALD J. QUIGG

Attesting Officer

Commissioner of Patents and Trademarks

REEXAMINATION CERTIFICATE (706th)
United States Patent [19]
Widdoes, Jr.

[11] B1 4,590,581

[45] Certificate Issued Jun. 9, 1987

[54] METHOD AND APPARATUS FOR MODELING SYSTEMS OF COMPLEX CIRCUITS

[75] Inventor: L. Curtis Widdoes, Jr., Sunnyvale, Calif.

[73] Assignee: Valid Logic Systems, Inc., San Jose, Calif.

Reexamination Request:
No. 90/001,072, Aug. 21, 1986

Reexamination Certificate for:
Patent No.: 4,590,581
Issued: May 20, 1986
Appl. No.: 492,985
Filed: May 9, 1983

Certificate of Correction issued Sep. 16, 1986.

[51] Int. Cl.$^4$ .................... G06G 7/48; G06G 11/00
[52] U.S. Cl. ................................ 364/578; 371/20
[58] Field of Search ............ 364/578, 149, 150, 151; 371/20, 23–27

[56] References Cited

U.S. PATENT DOCUMENTS

| | | | |
|---|---|---|---|
| 3,643,156 | 2/1972 | Stewart et al. | 364/482 |
| 3,758,761 | 9/1973 | Henrion | 371/8 |
| 3,777,129 | 12/1973 | Mehia | 364/580 |
| 3,812,337 | 5/1974 | Crosley | 371/57 |
| 3,927,371 | 12/1975 | Pomeranz et al. | 371/25 |
| 4,031,517 | 6/1977 | Hirtle | 364/200 |
| 4,066,882 | 1/1978 | Esposito | 371/20 |
| 4,070,565 | 1/1978 | Borelli | 364/580 |
| 4,156,132 | 5/1979 | Hazzard | 371/23 |
| 4,180,023 | 12/1979 | Kobayashi et al. | 123/478 |
| 4,180,203 | 12/1979 | Masters | 371/20 |
| 4,196,475 | 4/1980 | Hall | 364/482 |
| 4,213,175 | 7/1980 | Kurihara | 364/151 |
| 4,228,537 | 10/1980 | Henckels et al. | 371/23 |
| 4,242,751 | 12/1980 | Henckels et al. | 371/25 |
| 4,300,196 | 11/1981 | Lopresti | 364/489 |
| 4,306,286 | 12/1981 | Cocke et al. | 364/488 |
| 4,310,884 | 1/1982 | Roberts et al. | 364/578 |
| 4,317,200 | 2/1982 | Wakatsuki et al. | 371/25 |
| 4,342,093 | 7/1982 | Miyoshi | 364/578 |
| 4,348,759 | 9/1982 | Schnurmann | 371/20 |
| 4,354,268 | 10/1982 | Michel et al. | 371/20 |
| 4,357,703 | 11/1982 | Van Brunt | 371/15 |
| 4,402,055 | 8/1983 | Lloyd et al. | 364/580 |
| 4,404,627 | 9/1983 | Marcantonio | 364/900 |
| 4,404,635 | 9/1983 | Flaker | 364/580 |
| 4,450,560 | 5/1984 | Conner | 371/25 |
| 4,488,354 | 12/1984 | Chan et al. | 364/490 |
| 4,510,572 | 4/1985 | Reece et al. | 364/489 |
| 4,513,384 | 4/1985 | Rosencwaig | 364/578 |
| 4,527,249 | 7/1985 | Van Brunt | 364/578 |
| 4,555,756 | 11/1985 | Yamanaka | 364/578 |
| 4,587,625 | 5/1986 | Marino, Jr. et al. | 364/578 |

FOREIGN PATENT DOCUMENTS 2848621 5/1980 Fed. Rep. of Germany .

OTHER PUBLICATIONS

Huston, R., "Description of the Intel 8085 Microprocessor Test Programs for the Sentry II/VII With Sequence Processor Module," Application Note 67, Fairchild Systems Technology, Nov. 1977.

Fairchild Systems Technology, Application Note 57, "Testing a TV Character Generator with the Sentry II Sequence Processor" (no date, no author).

Huston, R., "'Microprocessor Testing'; A Testing Turnaround–Smart DUT Runs The Tester";, Proc. Int'l Microelectronics Conf., pp. 16–24, Feb. 11–13 and Jun. 17–19, 1975.

Huston, R. E., "Microprocessor Testing Equipment Needs", IEEE Computer Society 1975 Semiconductor Test Symposiu., pp. 59–68, Oct. 14–16, 1975.

Magnhagen, B., "DIGSIM II, an In Circuit Simulator," Proc. IEEE Int'l Conf. on Circuits and Computers, ICCC 80, vol. 1, pp. 571–573, Oct. 1–3, 1980.

Armstrong, J. R. et al., "Chip–Level Simulation of Microprocessors," *Computer*, vol. 13, No. 1, pp. 94–100, 1/80.

Beaven, P. A. et al., "Simulation and Testing of Three–State Logic Circuitry," IBM TDB vol. 21, No. 4, pp. 1662–1663, 9/78.

Szygenda, S. A. et al., "Modeling and Digital Simulation for Design Verification and Diagnosis," IEEE Trans. on Computers, vol. C–25, No. 12, pp. 1242–1253, 12/76.

Szygenda, S. A. et al., "Digital Logic Simulation in a Time–Based, Table–Driven Environment, Part 1, Design Verification," Computer, vol. 8, No. 3, pp. 24–36, 3/75.

Ulrich, E. G., "Exclusive Simulation of Activity in Digital Networks", Comm. ACM, vol. 12, No. 2, pp. 102–110, 2/69.

Smith, D. H., "Microprocessor Testing–Method or Madness", IEEE Computer Society 1976 Semiconductor Test Symposium, pp. 27–29, Oct. 19–21, 1976.

*Primary Examiner*—Felix D. Gruber

[57] ABSTRACT

A simulation model is provided which comprises a combination of the physical device to be modeled and means for controlling the physical device at normal operating speeds so as to avoid loss of data or of accumulated functions. Specifically, the physical device to be modeled is connected through a micro-system simulation means which can accept any of a wide variety of external devices and which includes the logic circuitry and control means necessary to allow the physical device to be stimulated and the resulting behavior observed under external control. Data and logic state patterns are preserved by effective control of the starting, stopping, cycling and resetting of the physical device.

REEXAMINATION CERTIFICATE ISSUED UNDER 35 U.S.C. 307

NO AMENDMENTS HAVE BEEN MADE TO THE PATENT

AS A RESULT OF REEXAMINATION, IT HAS BEEN DETERMINED THAT:

The patentability of claims 1-20 is confirmed.

* * * * *